United States Patent [19]

Pippin et al.

[11] Patent Number: 6,072,349
[45] Date of Patent: *Jun. 6, 2000

[54] COMPARATOR

[75] Inventors: Jack D. Pippin, Portland, Oreg.; Bal S. Sandhu, Fremont, Calif.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/001,608

[22] Filed: Dec. 31, 1997

[51] Int. Cl.$^7$ ................................ H03F 1/02; H03F 3/45
[52] U.S. Cl. ........................ 327/307; 327/65; 327/525; 327/563; 330/253; 330/261
[58] Field of Search ............................. 327/65, 108, 307, 327/525, 563; 330/253, 254, 261, 258

[56] References Cited

U.S. PATENT DOCUMENTS

| | | | |
|---|---|---|---|
| 4,967,197 | 10/1990 | Peng | 341/118 |
| 4,987,327 | 1/1991 | Fernandez et al. | 327/543 |
| 4,987,379 | 1/1991 | Hughes | 330/253 |
| 5,043,692 | 8/1991 | Sites et al. | 338/28 |
| 5,124,663 | 6/1992 | McEntarfer et al. | 330/9 |
| 5,334,891 | 8/1994 | Marbot | 327/281 |
| 5,408,885 | 4/1995 | Araki | 73/708 |
| 5,455,816 | 10/1995 | Bitting | 330/254 |
| 5,477,182 | 12/1995 | Huizer | 327/261 |
| 5,519,354 | 5/1996 | Audy | 327/512 |
| 5,550,512 | 8/1996 | Fukahori | 330/254 |
| 5,608,347 | 3/1997 | Kearney | 327/512 |
| 5,608,348 | 3/1997 | Kearney et al. | 327/538 |
| 5,619,122 | 4/1997 | Kearney et al. | 323/312 |
| 5,631,603 | 5/1997 | Stubbe et al. | 330/258 |
| 5,760,720 | 6/1998 | Nolan et al. | 341/120 |
| 5,781,060 | 7/1998 | Sugawara | 327/355 |
| 5,789,974 | 8/1998 | Ferguson, Jr. et al. | 330/9 |
| 5,798,637 | 8/1998 | Kim et al. | 323/313 |
| 5,821,741 | 10/1998 | Brokaw | 323/311 |
| 5,822,017 | 10/1998 | Mok | 348/678 |
| 5,873,053 | 2/1999 | Pricer et al. | 702/130 |

OTHER PUBLICATIONS

Sanchez et al., *Thermal Management System for High Performance PowerPC™ Microprocessors*, IEEE (1997).

*Primary Examiner*—Timothy P. Callahan
*Assistant Examiner*—Terry L. Englund
*Attorney, Agent, or Firm*—Trop, Pruner & Hu, P.C.

[57] ABSTRACT

A comparator includes an amplifier that has an offset voltage that is responsive to a level of current. A current source of the comparator is configured to be selectably enabled to adjust the level of the current to change the offset voltage.

19 Claims, 7 Drawing Sheets

COMPARATOR

CROSS REFERENCE TO RELATED APPLICATIONS

This application is related to U.S. patent application Ser. No. 09/001,606 entitled, "A METHOD AND APPARATUS FOR TRIMMING AN INTEGRATED CIRCUIT," with inventors Bal S. Sandhu and Jack D. Pippin, which is filed concurrently with this application and is hereby incorporated by reference.

BACKGROUND OF THE INVENTION

The invention relates to a comparator.

A comparator is an analog circuit that compares one analog signal with another analog signal and furnishes a binary value (i.e., indicates a high or low state) that indicates the result of the comparison. An analog signal is a signal that can have any value between ground and the power supply voltage level.

Figure 1:
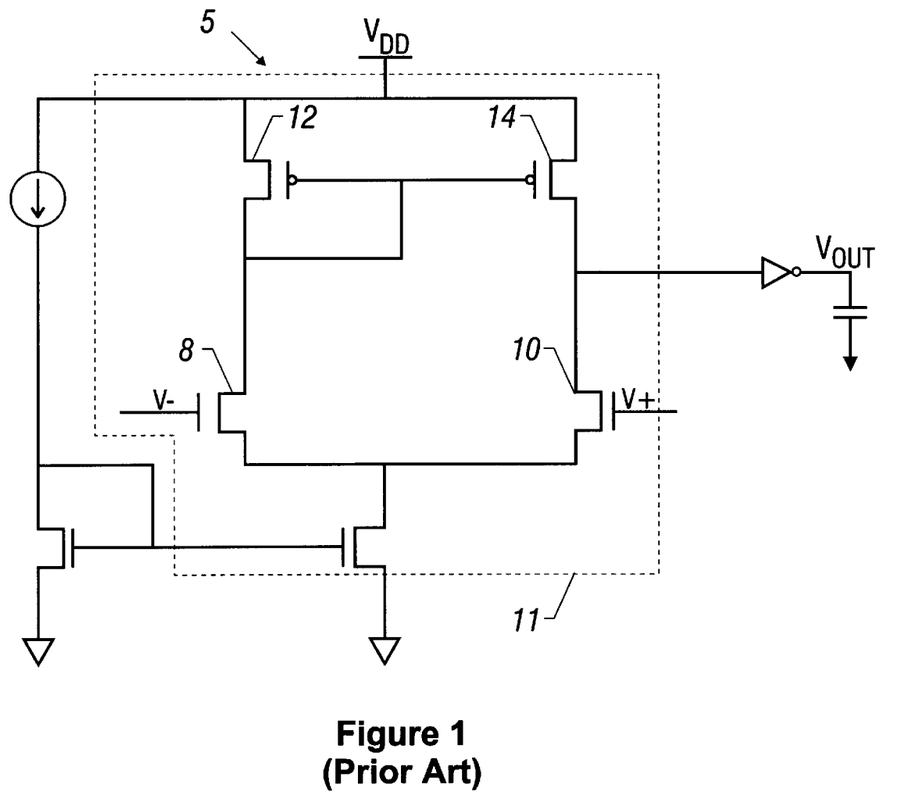
FIG. 1 is a schematic diagram of a comparator of the prior art.

FIG. 1 is a schematic diagram of a comparator 5. The comparator 5 compares a signal (called V+) at its positive, or non-inverting input, with a signal (called V−) at its negative, or inverting input. Ideally, when the difference between the V+ signal and the V− signal is positive, an output signal (called $V_{OUT}$) of the comparator 5 is high, and ideally, when the difference between the V+ signal and the V− signal is negative, the $V_{OUT}$ signal is low.

The comparator 5 typically has a differential amplifier 11 for amplifying the difference between the V+ and V− signals. The differential amplifier 11 is formed from a differential pair of transistors that might be, for example, an n-channel metal-oxide-semiconductor (NMOS) transistor 8 (that receives the V− signal) and an NMOS transistor 10 (that receives the V+signal). The transistors 8 and 10 are coupled together at their source, and each transistor 8, 10 forms part of a differential side of the amplifier 11. Each side of the amplifier 11 also has a load transistor (e.g., PMOS transistors 12 and 14), and these load transistors 12 and 14 are coupled together in a current mirror arrangement.

Ideally, the two sides are symmetrical so that when both the positive and negative input terminals of the amplifier 11 are coupled together, the currents and voltages on both sides of the amplifier 11 are the same. To achieve this symmetry, typically, the aspect ratios of the load transistors and the aspect ratios of the differential pair of the transistors are matched.

Figure 2:
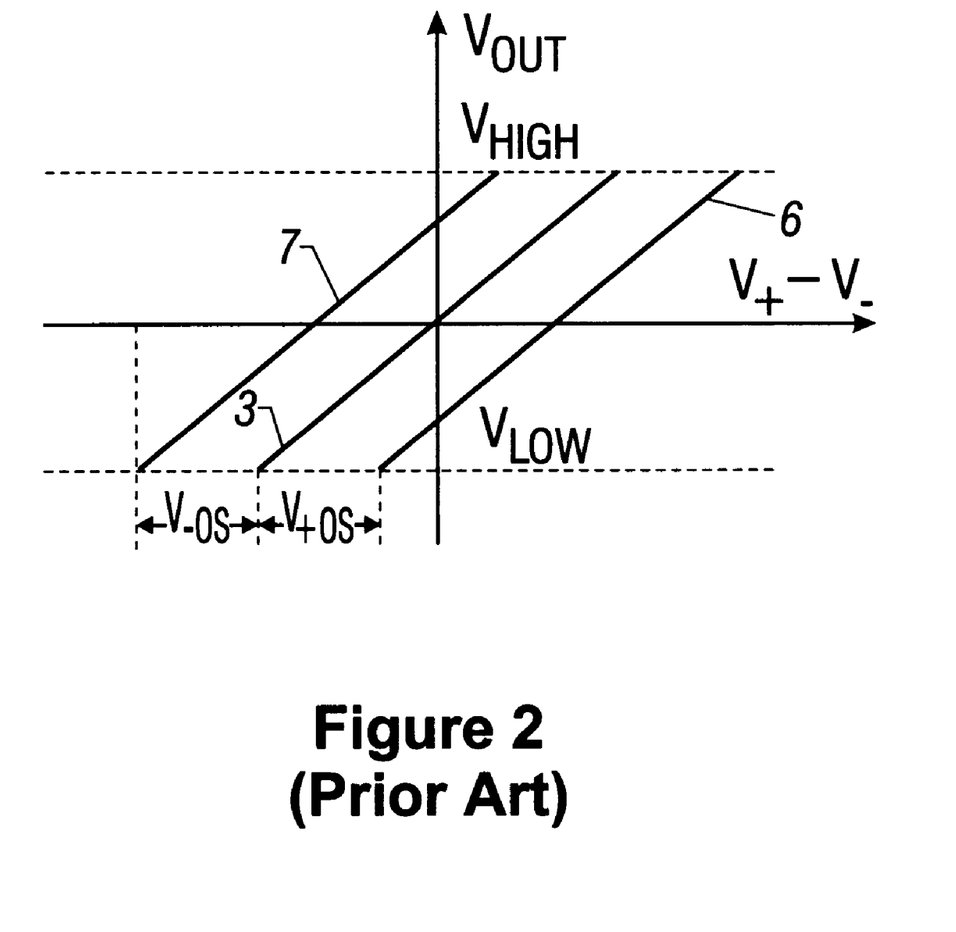
FIG. 2 is an illustration of voltage transfer curves for the comparator of FIG. 1.

FIG. 2 is an illustration of voltage transfer curves for the comparator 5. Quite often, due to variations in the process used to fabricate the comparator 5, the transistors of the amplifier 11 are not exactly matched. As a result, the comparator 5 does not exhibit ideal behavior (as shown by an ideal transfer curve 3), but rather has a small offset voltage present on one of the inputs of the comparator 5. For example, the comparator 5 may have an actual transfer curve 6 that is shifted to the right from the curve 3, and thus, the comparator 5 has a positive offset voltage (called $V_{+OS}$). Likewise, the comparator 5 may have an actual transfer curve 7 that is shifted to the left from the curve 3, and thus, the comparator 5 has a negative offset voltage (called $V_{-OS}$).

When the comparator 5 has an offset voltage, then the comparator 5 switches too early or too late, depending on the application which uses the comparator 5. Thus, this false switching can lead to an error in the output of the comparator. Although an attempt is often made to limit the extent of the offset voltage by matching the sizes of integrated devices (e.g., transistors) that form the comparator 5, quite often after fabrication, an offset voltage still exists.

Thus, a continuing need exists for a comparator that allows adjustment of an input offset voltage after fabrication.

SUMMARY OF THE INVENTION

In one embodiment, the invention is generally directed to a comparator which has current sources that are selectably enabled to adjust a characteristic (an offset voltage, for example) of the comparator.

Generally, in another embodiment, the invention features a comparator that includes an amplifier. The amplifier has an electrical characteristic that is responsive to a level of current. A current source of the comparator is configured to be selectably enabled to adjust the level of the current to change the characteristic.

In other embodiments of the invention, the comparator is part of a microprocessor. The comparator is configured to compare two input signals and based on the result of the comparison, provide an indication of a predetermined event to a clock generator. The clock generator is configured to furnish the clock signal to a processing core of the microprocessor. The clock generator is configured to change the frequency of the clock signal in response to the indication provided by the comparator.

Other advantages and features of the invention will become apparent from the following description and from the claims.

DETAILED DESCRIPTION

Figure 3:
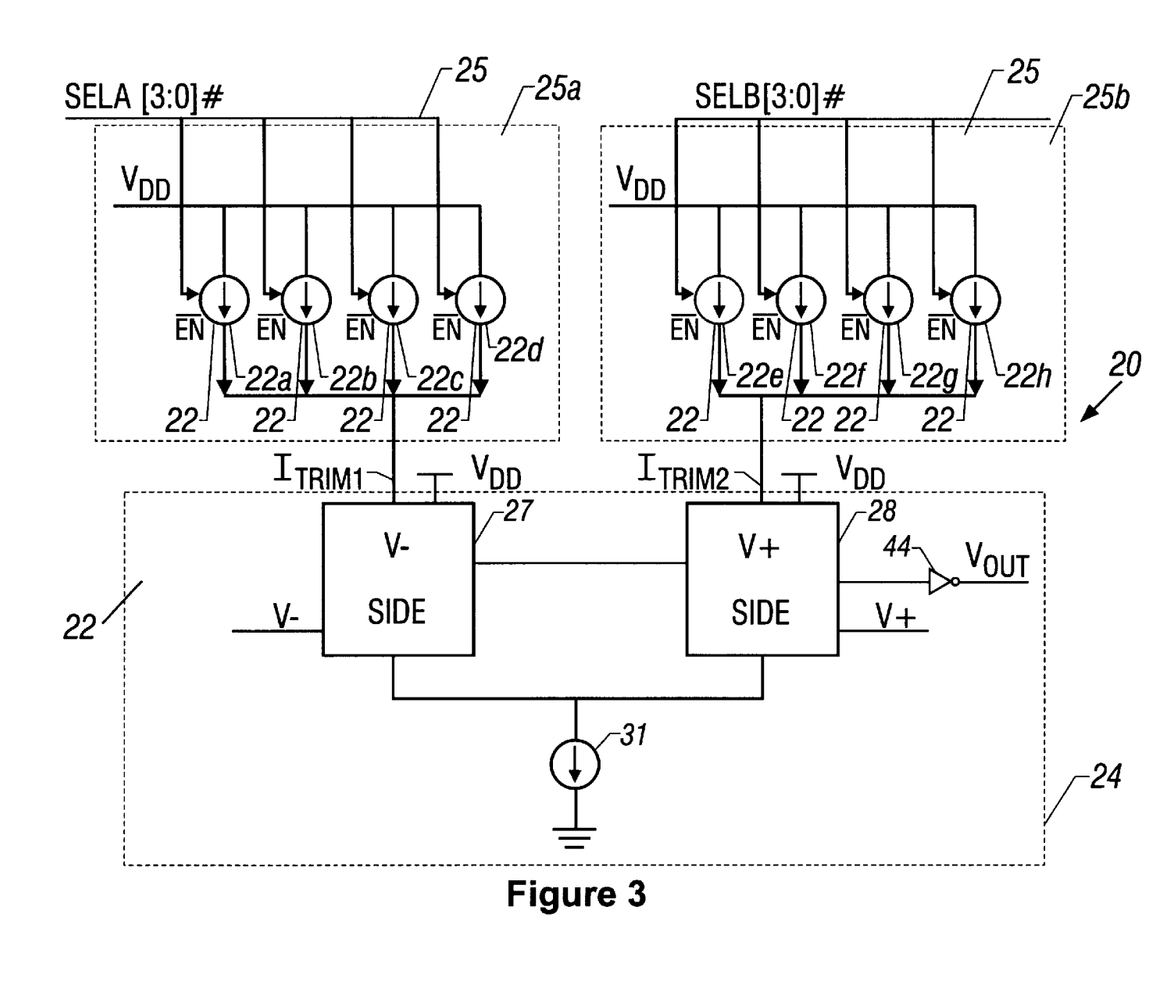
FIG. 3 is a schematic diagram of a comparator according to an embodiment of the invention.

FIG. 3 is a schematic diagram of a comparator 20. A differential amplifier 24 of the comparator 20 is configured to amplify the difference between a signal (called V+) at a positive input of the comparator 20 and a signal (called V−) at a negative input of the comparator 20. Like typical differential amplifiers, the amplifier 24 has two sides 27 and 28 which are ideally symmetrical. The side 27 amplifies the V− signal, and the side 28 amplifies the V+ signal.

Unlike typical comparators, the comparator 20 has current sources 22 that are constructed to be selectably enabled to adjust for asymmetric properties of the differential amplifier 24, such as an offset voltage of the amplifier 24. The current sources 22 are grouped into two banks 25 (i.e., bank 25a and bank 25b), and in each bank 25, the current sources 22 are coupled in parallel. The current sources 22 of each bank 25 are selectably enabled to adjust the current level in either side 27 or 28 of the differential amplifier 24.

Among the advantages of this arrangement are one or more of the following: Post fabrication correction may be performed to null an input offset voltage. Trimming accuracy may be improved. Minimal die area may be consumed.

The current sources 22 of the bank 25a (i.e., current sources 22a, 22b, 22c and 22d) are constructed to be selectably enabled to adjust a level of a current (called $I_{TRIM1}$) that is introduced into the V− side 27 of the differential amplifier. The current sources 22 of the bank 25b (i.e., current sources 22e, 22f, 22g and 22h) are constructed to be selectably enabled to adjust a level of a current (called $I_{TRIM2}$) that is introduced into the V+ side 28 of the differential amplifier 24.

Thus, the current sources 22 are selectably enabled to adjust current levels in one or both sides 27 and 28 of the differential amplifier 24. As a result, nonideal properties of the amplifier 24, such as an offset voltage, can be eliminated.

Each current source 22, when enabled, has a small level of current (e.g., 1 uA) as compared to the level of current (e.g., 100 uA) used to bias one side 27, 28 of the amplifier 24. In some embodiments, the comparator 20 is designed to have a zero input offset voltage when some of the current sources 22 of both banks 25 are enabled. As a result, when the comparator 20 is calibrated to null the input offset voltage, the current sources 22 that were designed to be enabled might be disabled to lower the designed level of the $I_{TRIM1}$ and/or $I_{TRIM2}$ current.

An output voltage signal (called $V_{OUT}$) of the comparator 20 is provided by the output terminal of an inverter 44. The input terminal of the inverter 44 is coupled to the output terminal of the V+ side 28.

The current sources 22 from either one or both banks 25 can be enabled to adjust the input offset voltage. Increasing the level of the $I_{TRIM1}$ current shifts the input/output voltage transfer curve of the comparator 20 to the left, and decreasing the level of the $I_{TRIM1}$ current shifts the input/output voltage transfer curve of the comparator 20 to the right. Increasing the level of the $I_{TRIM2}$ current shifts the input/output voltage transfer curve of the comparator 20 to the right, and decreasing the level of the $I_{TRIM2}$ current shifts the input/output voltage transfer curve of the comparator 20 to the left.

In some embodiments, each current source 22, when enabled, furnishes the same, predetermined level (e.g., 1 uA) of current, i.e., the current sources 22 of each bank implement a linear weighting scheme. In other embodiments, each current source 22 of each bank 25 is constructed to provide a different level of current. For example, in some embodiments, the current levels furnished by current sources 22 of each bank 25 are weighted to implement an 8-4-2-1 binary weighting scheme.

In these embodiments, the current sources 22 supply a multiple of a predetermined current Io (e.g., 1 ua). For example, for the bank 25a, the current source 22c, when enabled, furnishes twice as much current (2Io) as the current source 22d (which furnishes a current Io, when enabled). The current source 22b, when enabled, furnishes four times (4Io) as much current as the current source 22d, and the current source 22a, when enabled, furnishes eight times as much current (8Io) as the current source 22d. The current sources 22 of the bank 25b have a similar design.

In the rest of the description, it is assumed that the current sources 22 of the banks 25a and 25b are all configured to implement the linear weighting scheme. The binary weighting scheme is further described in the U.S. Patent Application entitled, "Trimming an Integrated Circuit."

Figure 4:
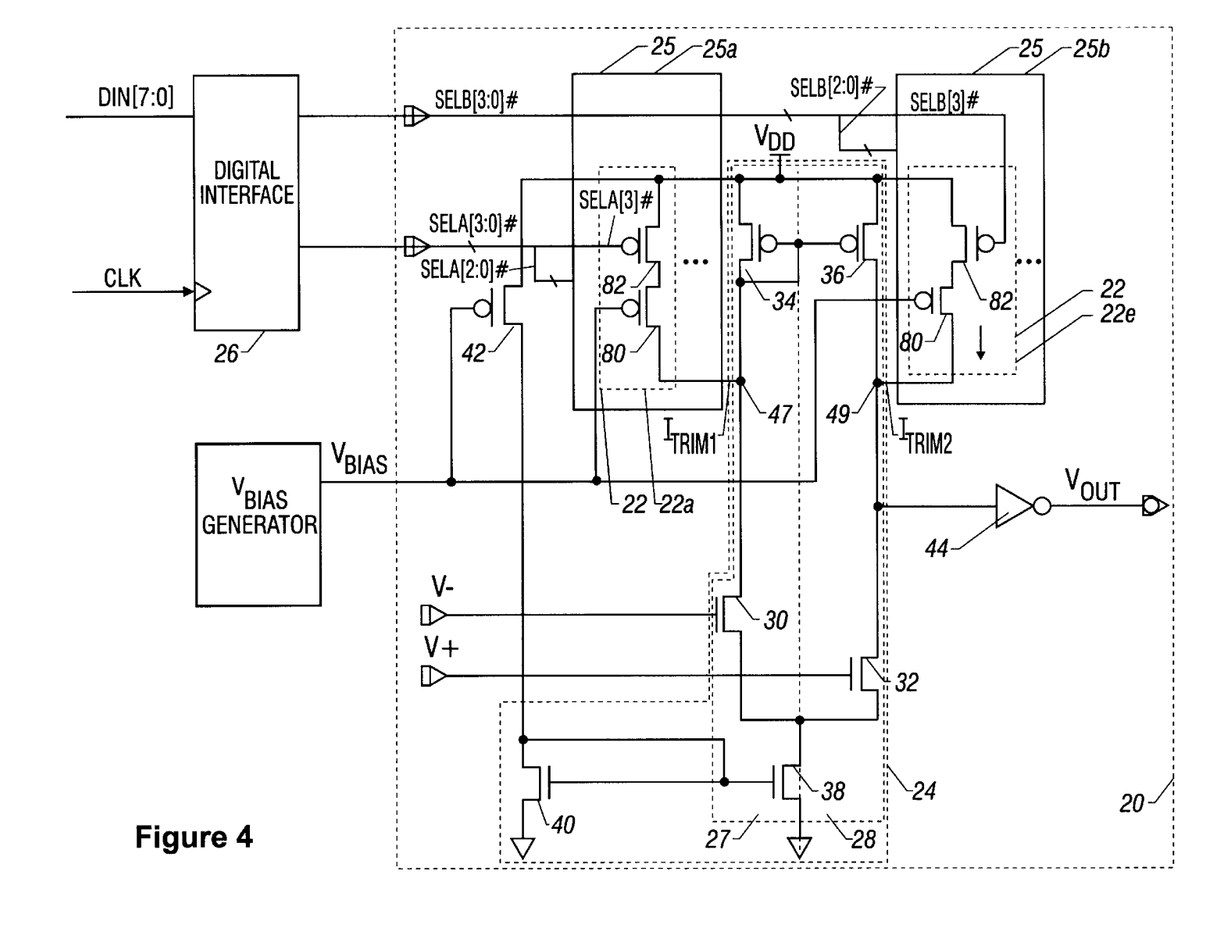
FIG. 4 is a more detailed schematic diagram of the comparator of FIG. 3.

In some embodiments, the comparator 20 is part of a microprocessor. During a test mode of the microprocessor, a digital interface 26 (see FIG. 4 showing a more detailed schematic diagram of the comparator 20) is used to calibrate the comparator 20 to zero the offset voltage. In this manner, the interface 26 is used to enable/disable the current sources 22 pursuant to a predetermined calibration sequence to determine which current sources 22 need to be permanently enabled/disabled to achieve the desired set point voltage level.

The interface 26 supplies two sets of four bit signals called SELA[3:0]# and SELB[3:0]#. Each different bit of the SELA[3:0]# and SELB[3:0]# signals is uniquely coupled to one of the current sources 22 and is used to selectably enable (when the output is low) and disable (when the output is high) that current source 22.

Each different bit of the SELA[3:0]# signal controls the enablement/disablement of a different one of the current sources 22 of the bank 25a. Similarly, each different bit of the SELB[3:0]# signal controls the enablement/disablement of the current sources 22 of the bank 25b.

As an example for one of many possible arrangements for the comparator, the comparator 20 might be designed so that design bias points are achieved when, for each bank 25, two of the current sources 22 are enabled and two of the current sources 22 are disabled. Thus, the calibration of the comparator 20 includes using the interface 26 to set the SELA [3:0]# signal equal to "0011b" (wherein the suffix "b" indicates a binary representation) and the SELB[3:0]# signal equal to "0011b." The inputs of the comparator 20 remain coupled together during the calibration.

If the $V_{OUT}$ signal of the comparator 20 is initially high, then either a cleared bit of the SELA[3:0]# signal is set (to decrease the level of the $I_{TRIM1}$ current) or a set bit of the SELB[3:0]# signal is cleared (to increase the level of the $I_{TRIM2}$ current). If the comparator 20 drives the $V_{OUT}$ signal level low in response to this change, then the previous values of SELA[3:0]# and SELB[3:0]# are used to blow fuses to permanently enable/disable the appropriate current sources 22, as described below.

Otherwise, the bits of the SELA[3:0]# and SELB[3:0]# signals are changed again in a repetitive process until the comparator 20 drives the $V_{OUT}$ output signal of the comparator 20 low. If the $V_{OUT}$ output signal is still high when all of the bits of the SELA[3:0]# signal are set (i.e., when all of the current sources 22 of the bank 25a are disabled) and all bits of the SELB[3:0]# signal are cleared (i.e., when all of the current sources 22 of the bank 25b are enabled), then the offset voltage cannot be corrected, given that there was an initial offset voltage.

If the $V_{OUT}$ signal is initially low, then either a cleared bit of the SELB[3:0]# signal is set (to decrease the level of the $I_{TRIM2}$ current) or a set bit of the SELA[3:0]# signal is cleared (to increase the level of the $I_{TRIM1}$ current). If the comparator 20 drives the $V_{OUT}$ signal high in response to this change, then the previous values of SELA[3:0]# and SELB[3:0]# are used to blow fuses to permanently enable/disable the appropriate current sources 22, as described below.

Otherwise, the bits of the SELA[3:0]# and SELB[3:0]# signals are changed again in a repetitive process until the comparator 20 drives the $V_{OUT}$ signal of the comparator 20 high. If the $V_{OUT}$ signal of the comparator 20 is still low when all of the bits of the SELB[3:0]# signal are cleared and all bits of the SELA[3:0]# signal are set, then the offset voltage cannot be corrected, given that an initial offset voltage existed.

As shown in FIG. 4, each current source 22 includes a p-channel metal-oxide-semiconductor (PMOS) transistor 80 that has a source-drain path which is serially coupled to the source-drain path of a PMOS selection transistor 82. The transistor 80 receives a bias voltage (called $V_{BIAS}$) at its gate and is coupled in a current mirror arrangement with the other transistors 80 of the other current sources 22 of the bank 25. The $V_{BIAS}$ voltage level establishes current flowing through the source-drain path of the transistor 80 when the current source 22 is enabled.

The source of the selection transistor 82 is coupled to a voltage supply level called $V_{DD}$, and the drain of the transistor 82 is coupled to the source of the transistor 80. The selection transistor 82 receives one of the bits of the SELA [3:0]# or SELB[3:0]# signals. When the bit is low, the source-drain path of the transistor 82 conducts which permits current to flow through the source-drain path of the transistor 80.

The differential amplifier 24 has two NMOS transistors 30 and 32 which form sides 27 and 28, respectively, of the differential pair. The transistors 30 and 32 have both of their sources coupled to the drain of an NMOS transistor 38 which furnishes bias current for the differential pair. The gate of the transistor 30 forms the inverting input of the comparator 20, and the gate of the transistor 32 forms the non-inverting input of the comparator 20.

The sides 27 and 28 of the differential amplifier 24 include PMOS transistors 34 and 36, respectively, that each function as a load for the side. The transistors 34 and 36 have their drains coupled to the drains of the transistors 30 and 32, respectively, to form nodes 47 and 49, respectively. The node 47 receives the $I_{TRIM1}$ current, and the node 49 receives the $I_{TRIM2}$ current. The transistors 34 and 36 have their sources both coupled to a supply voltage $V_{DD}$. The gate of the transistor 36 is coupled to the drain of the transistor 34 SO that the current in the source-drain path of the transistor 36 mirrors the current in the source-drain path of the transistor 34.

Although other arrangements are possible, as examples, the aspect ratios of the transistors 34 and 36 may be the same, and the aspect ratios of the transistors 30 and 32 may be the same.

The transistor 38 is coupled in a current mirror arrangement with an NMOS transistor 40. In this manner, the gate and drain of the transistor 40 are coupled together, and the gates of the transistors 38 and 40 are coupled together. In some arrangements, the transistors 40 and 38 have the same aspect ratio.

The current flowing through the drain-source path of the transistor 40 establishes the bias current in the differential pair. The current flowing through the drain-source path of the transistor 40 is established by a PMOS transistor 42 which has its drain coupled to the drain of the transistor 40 and its source coupled to the $V_{DD}$ supply voltage. The gate of the transistor 42 receives the $V_{BIAS}$ voltage level which effectively sets the level of current flowing through the transistors 38 and 40.

In some embodiments, the digital interface 26 includes an eight bit register that stores the SELA[3:0] signal (in the four most significant bits) and the SELB[3:0] signal (in the four least significant bits). Output terminals of the register provide the SELA[3:0]# and SELB[3:0]# signals. The interface 26 also includes data and control lines that are coupled to the register. Data is loaded into and retrieved from the register via a serial scan chain arrangement. In this manner, the register is serially linked to other test registers.

Figure 5:
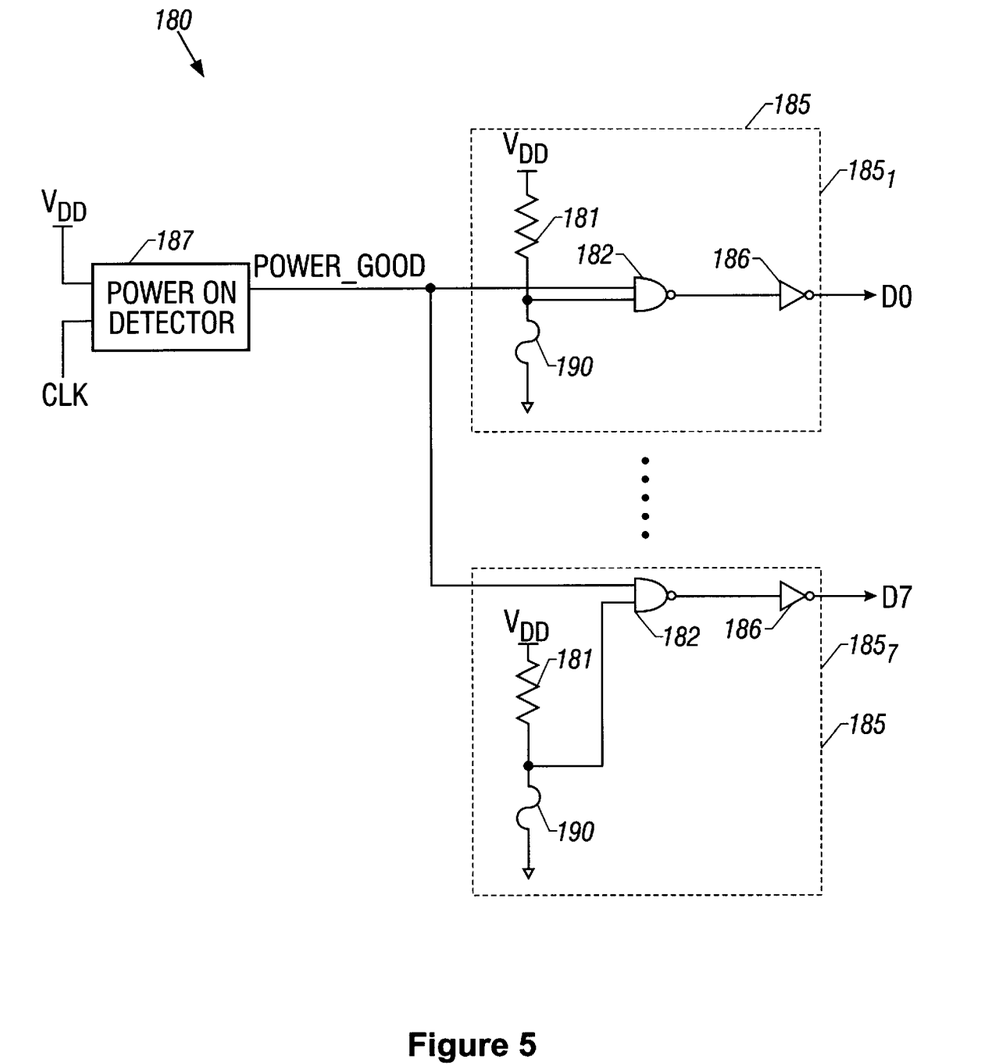
FIG. 5 is a schematic diagram of a fuse circuit for enabling/disabling a selected current source.

Referring to FIG. 5, to permanently enable/disable the current sources 22, in some embodiments, a fuse circuit 180 is used to permanently set bits of the interface 26. The fuse circuit 180 includes circuits 185 (i.e., circuits $185_1 \ldots 185_7$). Each different circuit 185 is constructed to set the logic level of a different bit of the interface 26.

To accomplish this, each circuit 185 has a fuse 190 that is blown to permanently set the associated bit of the interface 26 to a logic one value. If the fuse 190 is left intact, the associated bit has a logic zero value. The fuse 190 is coupled to the $V_{DD}$ supply voltage level through a pull-up resistor 181.

The junction of the resistor 181 and the fuse 190 furnishes a signal to one input terminal of a NAND gate 182. Another input terminal of the NAND gate 182 receives a POWER__GOOD signal from a power on detector circuit 187. The circuit 187 drives high, or asserts, the POWER_GOOD signal when the chip is powered up and deasserts, or negates, the POWER_GOOD signal otherwise. An inverter 186 is serially coupled to an output terminal of the NAND gate 182 and provides an output signal that is representative of one of the bits of the interface 26. Thus, when the POWER_GOOD signal is asserted, the values of the bits of the register 84 are dependent on the states of the associated fuses 190.

Other embodiments are possible for the fuse circuit 180. For example, the fuses used to enable/disable the current sources 22 might be part of a fuse memory. In this arrangement, the values from the fuse memory are permanently loaded into the interface 26 during a non-test mode.

Figure 6:
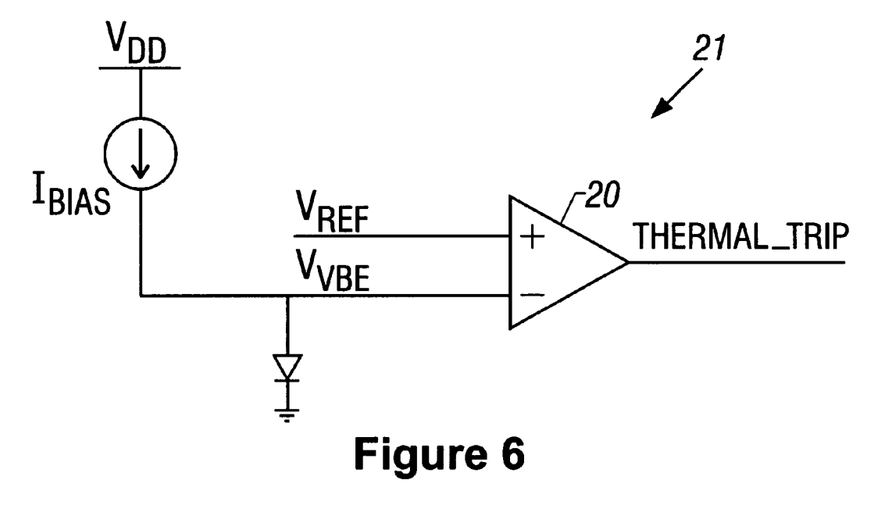
FIG. 6 is a schematic diagram of a thermal sensor.

Referring to FIG. 6, in some embodiments, the comparator 20 is part of a thermal sensor 21 that is constructed to monitor the temperature of a substrate. In these embodiments, the comparator 20 indicates (via a signal called THERMAL_TRIP) when the temperature of the substrate exceeds a predetermined temperature threshold.

The assertion of the THERMAL_TRIP signal alerts circuitry of the semiconductor device so that corrective action can be taken. For example, if the integrated circuit is a microprocessor, the corrective action might include adjusting a clock frequency to throttle back or shut down the microprocessor.

To generate the THERMAL_TRIP signal, the comparator 20 receives a signal (called $V_{REF}$) that electrically represents the threshold and a signal (called $V_{VBE}$) that electrically indicates the temperature of the substrate. The comparator 20 compares the voltage levels of these two signals, and based on the comparison, the comparator 20 either asserts, or drives high, the THERMAL_TRIP signal (to indicate an over temperature condition) or deasserts, or drives low, the THERMAL_TRIP signal (to indicate the temperature is normal).

The $V_{VBE}$ signal represents the forward voltage across a pn junction (represented by a diode 30) of the substrate. As typical, the forward potential across a pn junction varies linearly and inversely with respect to temperature. As a result, as the temperature of the substrate rises, the voltage level VBE drops.

The $V_{REF}$ signal is generated by a voltage reference circuit (not shown) of the sensor 21. The voltage reference circuit is constructed to set the $V_{REF}$ signal at a predetermined trip point voltage level that represents the electrical equivalent of the threshold inside the sensor 21. However, due to nonideal variations in the process used to fabricate the sensor 21, the voltage level of the $V_{REF}$ signal deviates from the predetermined trip point voltage level.

The voltage level of the $V_{REF}$ signal can also be calibrated using current sources, as further described in the U.S. patent application entitled "Trimming an Integrated Circuit."

Figure 7:
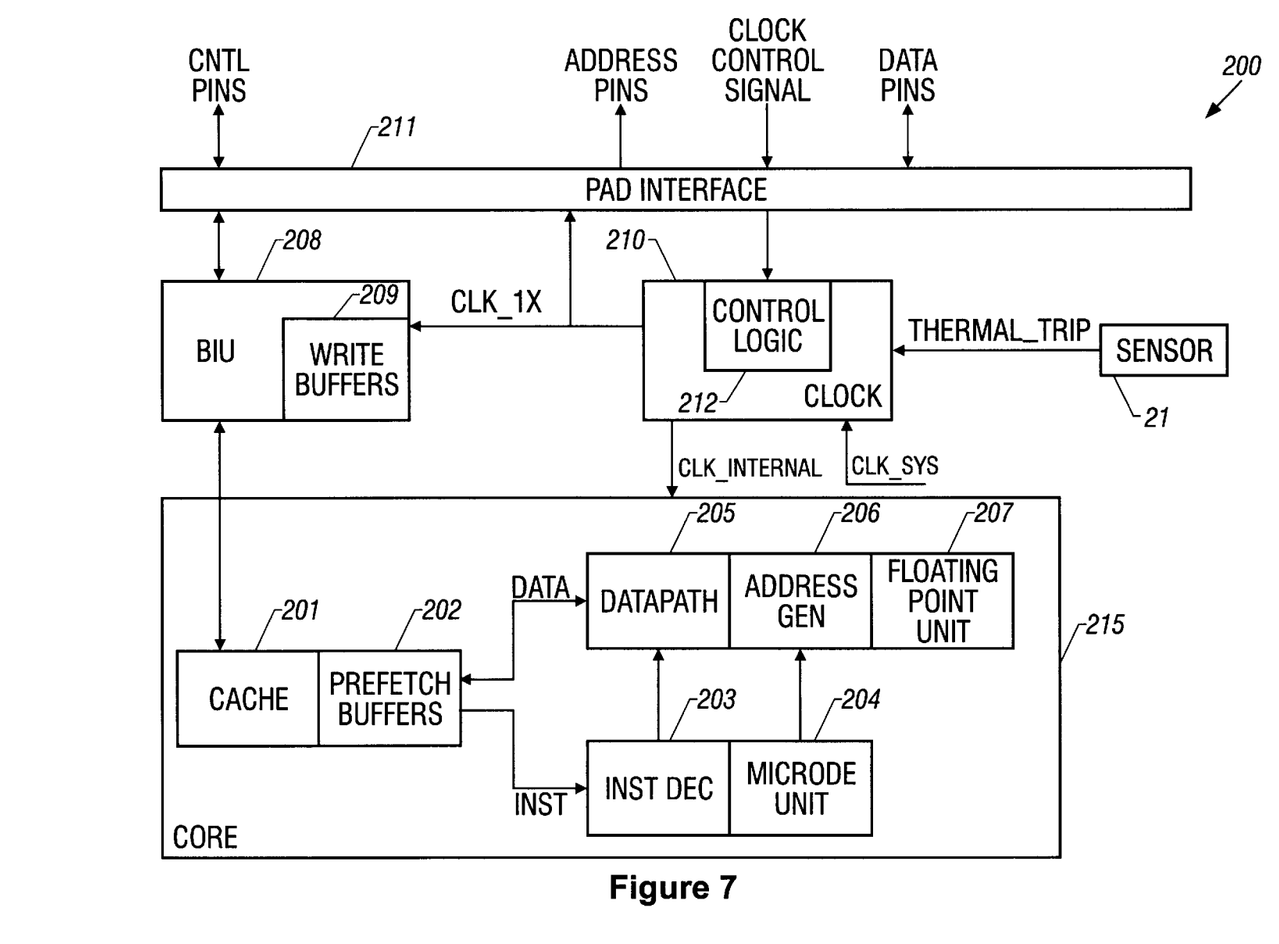
FIG. 7 is a schematic diagram of a microprocessor.

The sensor 21 can be used to monitor temperature in many different types of integrated circuits. FIG. 7 is a schematic diagram of one possible integrated circuit, a microprocessor 200.

The microprocessor 200 includes a processing core 215 that processes data of a computer system. The core 215 includes a cache 201, prefetch buffers 202, an instruction decoder 203, a microcode unit 204, datapath circuitry 205, an address generator 206 and a floating point unit 207. The cache 201 stores instructions and data for execution by the microprocessor 200. The prefetch buffers 202 retrieve data and instructions for execution by the microprocessor 200. The buffers 202 retrieves the data and instructions either from the cache 201 or if a cache miss occurs, from a memory of the computer system via a bus interface unit 208.

The instruction decoder 203 retrieves and decodes the instructions from the prefetch buffers 202. The microcode unit 204 has a memory that stores microcode instructions for the microprocessor 200. The microcode unit 204 interacts with the instruction decoder 203 to execute the instructions. To carry out execution of the instructions, the microcode unit 204 provides the address generator 206 with address information which the address generator 206 uses to generate addresses necessary to carry out the execution of the instructions. In a similar manner, the address generator 206 generates addresses for the datapath circuitry 205 and the floating point unit 207.

The microcode unit 204 is also responsible for instruction boundary processing, such as interrupt/exception arbitration, and the halting of the instruction decoder 203 when necessary. The microcode unit 204 also handles cache 201 misses.

The datapath circuitry 205 provides the main execution data path for the microprocessor 200. The datapath circuitry 205 includes an arithmetic logic unit (ALU), control registers, a barrel shifter, read only memory (ROM) and flags. The datapath circuitry 205 retrieves data from the prefetch buffers 202. The datapath circuitry 205 executes microcode provided by the instruction decoder 203 using data received from the prefetch buffers 202 according to the addresses generated by the address generator 206. The floating point unit 207 is used in the execution of floating point instructions.

Outside of the processing core 215, the microprocessor 200 has the bus interface unit 208, a pad interface 211, and a clock generator 210. The bus interface unit 208 provides an interface between internal buses of the microprocessor 200 and external buses that are used to fetch data and instructions from a memory of the computer system. The bus interface 208 has write buffers 209 that are used to store data to be transferred from the microprocessor 200 to the rest of the computer system. The pad interface 211 provides a pin interface for control, address and data signals passed between the microprocessor 200 and the rest of the computer system.

The clock generator 210 receives a system clock signal (called CLK_SYS) and uses the CLK_SYS to generate clock signals for the microprocessor 200. The clock generator 210 furnishes a clock signal (called CLK_1X) to the bus interface unit 208 and the pad interface 211. When the microprocessor 200 is not overheating (as indicated by the deassertion of the THERMAL_TRIP signal), the CLK_1X signal has the same frequency as the CLK_SYS signal, and portions of the bus interface unit 208 that interact with the pad interface 211 use the CLK_1X signal.

The clock generator 210 furnishes another clock signal (called CLK_INTERNAL) to the processing core 215. The CLK_INTERNAL signal is synchronized to the CLK_SYS signal and has a frequency that is a multiple (e.g., a multiple of two) of the frequency of the CLK_SYS signal. As a result, when the microprocessor 200 is operating under normal conditions, the processing core 215 generally operates at a higher frequency than the rest of the computer system.

Control logic 212 of the clock generator 210 receives the THERMAL_TRIP signal. When the THERMAL_TRIP signal is asserted, the control logic 212, depending on its configuration, alters the frequency of the CLK_INTERNAL signal to slow down the processing core 215 and reduce thermal buildup in the substrate of the microprocessor 200. In this manner, when the THERMAL_TRIP signal is asserted, the control logic 212 either throttles back the frequency of the CLK_INTERNAL signal or temporarily halts the CLK_INTERNAL signal.

In some embodiments, the clock generator 210 stops the microprocessor 200 for a predetermined duration (e.g., 50 us) when the substrate overheats to allow the microprocessor 200 to cool down. Afterwards, the clock generator 210 allows operations of the microprocessor 200 to start again for a predetermined duration (e.g., 50 us). At the end of this duration, the clock generator 210 checks the state of the THERMAL_TRIP signal, and if the THERMAL_TRIP signal is asserted, the on/off cycle is repeated.

Examples of possible implementations of the clock generator 210 are further described in U.S. Pat. Nos. 5,537,581 and 5,546,568 which are hereby incorporated by reference.

While the invention has been disclosed with respect to a limited number of embodiments, those skilled in the art will appreciate numerous modifications and variations therefrom. It is intended that the appended claims cover all such modifications and variations as fall within the true spirit and scope of the invention.

What is claimed is:

1. A comparator system comprising:
    an amplifier having an electrical characteristic responsive to a level of current;
    current sources to be selectably enabled to adjust the level of the current to change the electrical characteristic; and
    a circuit comprising:
        fuses to be selectably blown to selectably enable the current sources, wherein at least one of the fuses is coupled between two potentials;
        a resistor coupled between one of the potentials and said one of the fuses, the resistor indicating whether said one of the fuses is blown; and
        logic coupled to the resistor to generate an indication of whether said one of the fuses is blown based on the indication from the resistor.

2. The comparator system of claim 1, wherein the electrical characteristic comprises an offset voltage of the amplifier.

3. The comparator system of claim 2, wherein the current sources move the offset voltage toward a desired value when enabled.

4. The comparator system of claim 1, wherein at least one of the current sources comprises:
    a first transistor having a current path and a control terminal, the first transistor to receive a bias voltage at the control terminal and furnish a predetermined current via the current path, a level of the predetermined current based on the bias voltage; and
    a second transistor to couple the current path of the first transistor to the amplifier when said at least one of the current sources is enabled.

5. The comparator system of claim 1, further comprising:
    an interface to store bits for selectably enabling the current sources.

6. The comparator system of claim 5, wherein the interface includes a register.

7. The comparator system of claim 1, wherein the amplifier compares two input signals and provides an indication of the comparison.

8. The comparator system of claim 1, wherein the amplifier comprises a differential amplifier.

9. The comparator system of claim 1, wherein at least one of the current sources, when enabled, furnishes more current than at least one of the other current sources when enable.

10. The comparator system of claim 1, wherein each current source, when enabled, furnishes a current that is binarily weighted with respect to a current furnished by another one of the current sources.

11. A sensor comprising:
   a sensing element furnishing a first signal indicative of a temperature;
   a first circuit to generate a second signal indicative of a temperature threshold;
   an amplifier to receive the first and second signals and indicate a comparison of the temperature indicated by the first signal and the temperature threshold indicated by the second signal, the amplifier having an electrical characteristic responsive to a level of current;
   current sources being selectably enabled to adjust the level of the current to change the electrical characteristic; and
   a second circuit comprising:
      fuses to be selectably blown to selectably enable the current sources, wherein at least one of the fuses is coupled between two potentials;
      a resistor coupled between one of the potentials and said one of the fuses, the resistor indicating whether said one of the fuses is blown; and
      logic coupled to the resistor to generate an indication of whether said one of the fuses is blown based on the indication from the resistor.

12. The sensor of claim 11, wherein the electrical characteristic comprises an offset voltage of the amplifier.

13. The sensor of claim 12, wherein the current sources move the characteristic toward a desired value when enabled.

14. The sensor of claim 11, wherein at least one of the current sources comprises:
   a first transistor having a current path and a control terminal, the first transistor to receive a bias voltage at the control terminal and furnish a predetermined current via the current path, a level of the predetermined current based on the bias voltage; and
   a second transistor to couple the current path of the first transistor to the amplifier when said at least one current source is enabled.

15. The sensor of claim 11, further comprising:
   an interface to store bits for selectably enabling the current sources.

16. The sensor of claim 15, wherein the interface includes a register.

17. The sensor of claim 11, wherein the amplifier comprises a differential amplifier.

18. The sensor of claim 11, wherein at least one of the current sources, when enabled, furnishes more current than at least one of the other current sources when enabled.

19. The sensor of claim 11, wherein each current source, when enabled, furnishes a current that is binarily weighted with respect to a current furnished by another one of the current sources.

* * * * *